(12) United States Patent
Schuster

(10) Patent No.: US 7,495,840 B2
(45) Date of Patent: Feb. 24, 2009

(54) VERY HIGH-APERTURE PROJECTION OBJECTIVE

(76) Inventor: Karl-Heinz Schuster, Rechbergweg 24, 89551 Koenigsbronn (DE)

( * ) Notice: Subject to any disclaimer, the term of this patent is extended or adjusted under 35 U.S.C. 154(b) by 0 days.

(21) Appl. No.: 11/723,441

(22) Filed: Mar. 20, 2007

(65) Prior Publication Data

US 2007/0188880 A1    Aug. 16, 2007

Related U.S. Application Data

(60) Division of application No. 10/935,321, filed on Sep. 8, 2004, now Pat. No. 7,203,008, which is a continuation-in-part of application No. PCT/EP02/04846, filed on May 3, 2002.

(30) Foreign Application Priority Data

Mar. 8, 2002   (DE) ................... 102 10 899

(51) Int. Cl.
   *G02B 3/00*   (2006.01)
(52) U.S. Cl. ...................... 359/651; 359/649
(58) Field of Classification Search ......... 359/649–651
   See application file for complete search history.

(56) References Cited

U.S. PATENT DOCUMENTS

| 4,480,910 | A |   | 11/1984 | Takanashi et al. |
|---|---|---|---|---|
| 4,509,852 | A |   | 4/1985 | Tabarelli et al. |
| 5,121,256 | A | * | 6/1992 | Corle et al. ................. 359/664 |
| 5,691,802 | A |   | 11/1997 | Takahashi |
| 5,742,436 | A |   | 4/1998 | Fürter |
| 5,986,824 | A |   | 11/1999 | Mercado |
| 6,008,884 | A |   | 12/1999 | Yamaguchi et al. |
| 6,097,537 | A |   | 8/2000 | Takahashi et al. |
| 6,169,627 | B1 |   | 1/2001 | Schuster |
| 6,191,429 | B1 |   | 2/2001 | Suwa |
| 6,349,005 | B1 |   | 2/2002 | Schuster et al. |
| 6,486,940 | B1 |   | 11/2002 | Williamson |

(Continued)

FOREIGN PATENT DOCUMENTS

EP    0 023 231 A1    2/1981

(Continued)

OTHER PUBLICATIONS

M. Switkes and M. Rothchild, Immersion lithography at 157 nm, J. Vac. Sci. Technol. B, Nov./Dec. 2001, pp. 2353-2356, vol. 19, No. 6.

(Continued)

*Primary Examiner*—William C Choi
(74) *Attorney, Agent, or Firm*—Sughrue Mion, PLLC

(57) ABSTRACT

A very high-aperture, purely refractive projection objective having a multiplicity of optical elements has a system diaphragm (5) arranged at a spacing in front of the image plane. The optical element next to the image plane (3) of the projection objective is a planoconvex lens (34) having a substantially spherical entrance surface and a substantially flat exit surface. The planoconvex lens has a diameter that is at least 50% of the diaphragm diameter of the system diaphragm (5). It is preferred to arrange only positive lenses (32, 33, 34) between the system diaphragm (5) and image plane (3). The optical system permits imaging in the case of very high apertures of $NA \geq 0.85$, if appropriate of $NA \geq 1$.

16 Claims, 2 Drawing Sheets

U.S. PATENT DOCUMENTS

| | | |
|---|---|---|
| 6,631,036 B2 | 10/2003 | Schuster |
| 6,700,645 B1 | 3/2004 | Shigematsu |
| 6,995,930 B2 | 2/2006 | Shafer et al. |
| 2002/0001141 A1 | 1/2002 | Shafer et al. |
| 2002/0005938 A1 | 1/2002 | Omura |
| 2002/0024741 A1 | 2/2002 | Terasawa et al. |
| 2003/0011755 A1 | 1/2003 | Omura et al. |
| 2003/0030916 A1 | 2/2003 | Suenaga |
| 2003/0174301 A1 | 9/2003 | Imanishi |
| 2004/0062491 A1 | 4/2004 | Sato et al. |
| 2006/0007532 A1 | 1/2006 | Shafer |

FOREIGN PATENT DOCUMENTS

| | | |
|---|---|---|
| EP | 0 605 103 B | 7/1994 |
| EP | 1 061 396 A2 | 12/2000 |
| EP | 1 094 350 A2 | 4/2001 |
| EP | 1 139 138 A1 | 10/2001 |
| JP | 11006957 | 1/1999 |
| JP | 2000171707 | 9/2000 |
| JP | 2000352666 | 12/2000 |
| JP | 2001-23887 | 1/2001 |
| JP | 2001228401 | 8/2001 |
| JP | 2001343582 | 12/2001 |
| JP | 2002 244035 A | 8/2002 |
| JP | 2002277742 | 9/2002 |
| JP | 2002323653 | 11/2002 |
| JP | 2003185920 | 7/2003 |
| WO | 0123935 | 4/2001 |
| WO | WO 01 51979 A2 | 7/2001 |
| WO | WO 01 65296 A1 | 9/2001 |
| WO | WO 02 091078 A1 | 11/2002 |
| WO | WO 03 077037 A | 9/2003 |

OTHER PUBLICATIONS

Hiroaki Kawata et al., Fabrication of 0.2 μm Fine Patterns Using Optical Projection Lithography with an Oil Immersion Lens, Japanese Journal of Applied Physics, Dec. 31, 1992, pp. 4174-4177, vol. 31, No. 12B, Part 1.

Hiroaki Kawata et al., Optical projection lithography using lenses with numerical apertures greater than unity, Microelectronic Engineering, May 9, 1989, pp. 31-36, vol. 9, Nos. 1-4, Elsevier Publishers BV., Amsterdam, NL.

Willi Ulrich et al., Trends in Optical Design of Projection Lenses for UV- and EUV-Lithography, Proceedings of SPIE, Aug. 3, 2000, pp. 13-24, vol. 4146,SPIE, Bellingham, VA., US.

* cited by examiner

VERY HIGH-APERTURE PROJECTION OBJECTIVE

This is a divisional of application Ser. No. 10/935,321 filed on Sep. 8, 2004, now U.S. Pat. No. 7,203,008, which is a continuation-in-part application of international patent application PCT/EP02/04846, which was filed on May 3, 2002 and claims the priority of German patent application DE 102 10 899.4, which was filed on Mar. 8, 2002. The full disclosures of application Ser. No. 10/935,321, international patent application PCT/EP02/04846, German patent application DE 102 10 899.4, and U.S. patent application with Ser. No. 10/379,809, which is based on German patent application DE 102 10 899.4 and was filed on Mar. 6, 2003, are considered part of the disclosure of the accompanying divisional application, and are hereby incorporated into this description by reference.

BACKGROUND OF THE INVENTION

1. Field of the Invention

The invention relates to a projection objective for projecting a pattern arranged in the object plane of the projection objective into the image plane of the projection objective with the aid of ultraviolet light of a prescribed operating wavelength.

2. Description of the Related Art

Photolithographic projection objectives have been in use for several decades for producing semiconductor components and other finely structured components. They serve the purpose of projecting patterns of photomasks or reticles, which are also denoted below as masks or reticles, onto an object, coated with a photosensitive layer, with a very high resolution on a reducing scale.

Three developments running in parallel are chiefly used in order to generate ever finer structures of the order of magnitude of 100 nm or below. Firstly, an attempt is being made to enlarge the image-side numerical aperture (NA) of the projection objective beyond the currently achievable values into the region of NA=0.8 or thereabove. Secondly, use is being made of ever shorter operating wavelengths of ultraviolet light, preferably wavelengths of less than 260 nm, for example 248 nm, 193 nm, 157 nm or below. Finally, still other measures are being used to increase resolution, for example, phase-shifting masks and/or oblique illumination. In particular, the use of phase-shifting masks requires non-obscured systems, that is to say systems without shading in the image field. Systems without shadows in the image field are generally to be preferred in microlithography, even if obscured systems with otherwise outstanding optical properties are available (for example, DE 196 39 586 corresponding to U.S. Pat. No. 6,169,627 B1).

Limits to angular loadability are reached, above all, for the lenses near the image, when the aperture is increased significantly above NA=0.85. Larger apertures of about NA=1 or above are to be regarded as impractical, since it has to be assumed that because of total reflection in conjunction with such high apertures edge and coma beams can neither be coupled out from an objective nor be coupled into the photosensitive layer of the substrate.

SUMMARY OF THE INVENTION

It is one object of the invention to create a projection objective that is distinguished by a high image-side numerical aperture, an image field large enough for practical use in wafer steppers or wafer scanners, and has a good correction state.

In accordance with one formulation of the invention, in order to achieve this object and other objects, the invention provides a projection objective for projecting a pattern arranged in the object plane of the projection objective into an image plane of the projection objective with the aid of ultraviolet light of a prescribed operating wavelength, which projection objective comprises:

a multiplicity of optical elements which are arranged along an optical axis; and a system diaphragm arranged at a spacing in front of the image plane and having a diaphragm diameter;

the optical group with refractive power next to the image plane being a planoconvex group having a substantially spherical entrance surface and a substantially flat exit surface; and the planoconvex group having a diameter that is at least 50% of the diaphragm diameter.

Advantageous developments are specified in the dependant claims. The wording of all the claims is incorporated in the content of the description by reference.

In accordance with one aspect of the invention, a projection objective for projecting a pattern arranged in the object plane of the projection objective into the image plane of the projection objective with the aid of ultraviolet light of a prescribed operating wavelength has a multiplicity of optical elements which are arranged along an optical axis, and a system diaphragm arranged at a spacing in front of the image plane and having a diaphragm diameter. The optical group with refractive power next to the image plane is a planoconvex group having a substantially spherical entrance surface and a substantially flat exit surface. The exit surface is the last optical surface of the system and needs to be arranged in the vicinity of a substrate to be exposed, but without touch contact with the latter. If appropriate, optical contact can be mediated via an immersion medium, for example, a liquid. The planoconvex group has a diameter that is at least 50% of the diaphragm diameter. The diameter of the planoconvex group can preferably even be more than 60% or more than 70% of the diaphragm diameter.

The system diaphragm within the meaning of this application is the region in which a main beam of the projection intersects the optical axis for the last time prior to reaching the image plane. A diaphragm for limiting and, if appropriate, for adjusting the aperture used can be arranged in the region of the system diaphragm. In the case of systems with at least one intermediate image, there exists at least one further diaphragm plane with a larger distance from the image plane.

It is possible by means of the abovementioned measures to implement very high image-side numerical apertures $NA \geq 0.85$, it even being possible for the numerical aperture to be $NA=1$ or more, for example $NA=1.1$. It is thereby possible for structural widths of the order of magnitude of 50 nm to be effectively projected using operating wavelengths, for example of 193 nm, that can conventionally be well managed. High apertures, in particular in the region of $NA=1$ or above, require special measures in order to manage the superficial loading of the optical surfaces overall, and, in particular, the superficial loading in the region between the system diaphragm and the image plane. It is impermissible for high apertures related to components to arise in this region, since given a very oblique incidence of light, a large proportion of the incident light can no longer pass through the transparent optical elements, and can thus no longer contribute to the image production. If use is made as refractive group next to the image of a planoconvex group that is so thick axially that its diameter reaches more than half the diaphragm diameter, then by comparison with conventional lenses the strongly curved entrance surface has an unusually large dimension. Given a high opening of the lens surface, the aim should be a longer radius of the entrance surface since this brings about a reduction in the field loading. The longer the radius of the last entrance surface in front of the image plane, the smaller is the relative field, and the smaller therefore are also the induced field aberrations. This renders it possible for high beam apertures produced in front of the planoconvex lens in a suitable way to be transferred as far as the action site in the image plane with few aberrations and acceptable light losses.

In a preferred development, the planoconvex group is formed by a single, unipartite planoconvex lens. It is also possible to design the planoconvex group in the form of a divided planoconvex lens whose parts are preferably wrung onto one another. The division can be performed along a flat or curved dividing surface. A division renders it possible, in particular, for the part of the planoconvex group near the image field, in which particularly high radiation energy densities occur, to be produced from a particularly radiation-resistant material, such as calcium fluoride, for example, while regions of lesser radiation loading can be produced from another material, for example synthetic quartz glass. It is possible, if appropriate, to provide a plane-parallel end plate as that element of the planoconvex group which is nearest to the image. This is preferably wrung onto the preceding optical element. It is also possible within narrow limits for the planoconvex group to be split up into separate lens elements between which at least some regions can have a small air spacing which should, however, be substantially below one millimeter. The radii should be so curved in relation to the air gap that no total reflection takes place. Depending on the angular loadability of the thin coating layer, the angular loading in this case preferably remains smaller than sin u' from 0.85 to 0.95.

In accordance with another aspect of the invention, it is particularly advantageous when only lenses with positive refractive power are arranged between the system diaphragm and the image plane, if appropriate with the addition of one or more plane-parallel, transparent plates. For example, at least one biconvex positive lens can be arranged between the system diaphragm and the planoconvex group. At least two, in particular exactly two, biconvex positive lenses are more advantageous. In a preferred embodiment, two positive lenses, which provide the essential proportion of the system refractive power, are placed in front of a planoconvex meniscus. Owing to the fact that said positive lenses are seated right next to the system diaphragm, and can operate in a large diameter, a very small relative field loading can be achieved here, as well. This results in a very simple and efficient design of a projection objective with reference to the region behind the system diaphragm. It is accordingly advantageous when the last lens group arranged between the system diaphragm and image plane has a maximum of four optical elements with refractive power, ideally only three lenses, which are preferably positive lenses in each case. Lenses with negative refractive power can be provided as long as their refractive power is low by comparison with the total refractive power of the lens group arranged between the system diaphragm and image plane. Plane-parallel plates can be provided in addition.

A refractive power distribution advantageous for a high image-side numerical aperture is distinguished by the fact that the last lens group arranged between the system diaphragm and image plane advantageously has a focal length that is less than 20% or 17%, in particular less than 15% of the overall length of the projection objective. Here, overall length denotes the axial spacing between the object plane and the image plane, which is optically conjugate therewith. The spacing between the system diaphragm and image plane is preferably less than 25%, in particular less than 22% of the overall length and/or less than approximately 95%, 90% or 86% of the diaphragm diameter. Consequently, a position of the system diaphragm very near the image is advantageous overall. In this case, the diaphragm can be real or, equivalently the conjugate site of the real diaphragm given the presence of an intermediate image.

Inventive projection objectives can be of catadioptric or dioptric design and are to project without obscuration. Preference is given to purely refractive, that is to say, dioptric projection objectives for which all the optical components having refractive power consist of transparent material. One example involves a single-waist system with a belly near the object, a belly near the image and a waist therebetween, in the region of which the beam diameter is preferably less than approximately 50% of the maximum beam diameter in the region of one of the bellies.

The systems can be designed such that all the transparent optical elements are produced from the same material. Synthetic quartz glass is used for all the lenses in the case of an embodiment designed for an operating wavelength of 193 nm. Embodiments for 157 nm, in the case of which all the lenses consist of calcium fluoride or another crystal fluoride material, are also possible. Also possible are combinations of a plurality of different materials, for example in order to facilitate the correction of chromatic aberrations, or to reduce compaction. For example, for 193 nm the synthetic quartz glass can be replaced by a crystal material, for example calcium fluoride.

Very high-aperture projection objectives, in particular also purely refractive projection objectives, for which the image-side numerical aperture is NA≧0.85 are possible within the scope of the invention. The said aperture is preferably at least 1 and has a value of NA=1.1 in an embodiment explained in greater detail below. Despite these high numerical apertures, it is possible via a gas-filled gap for sufficient light energy to be coupled into the substrate to be exposed when a sufficiently small image-side working distance is observed. In the case of preferred embodiments, said working distance is below four times the operating wavelength used, in particular below the operating wavelength. It is particularly advantageous when the working distance is less than half the operating wavelength, for example less than one third, one quarter or one fifth of the operating wavelength. For these short working distances, it is possible to image in the optical near field, and in this case evanescent fields that existed in the immediate vicinity of the last optical surface of the imaging system are used for imaging. The projection objectives are also suitable for immersion lithography, in the case of which the space between the exit surface of the objective and the substrate is filled with an immersion fluid having a suitable refractive index and adequate transmission for the wavelength used. Suitable immersion fluids can include, for example, chiefly the elements H, F, C or S. De-ionized water can also be used.

Despite these extreme values for numerical aperture and working distance, thanks to the invention, it is possible to have objectives with a very large image field diameter which is adequate for practical lithography and, in the case of preferred embodiments, is greater than approximately 10 mm, in particular greater than approximately 20 mm, and/or can be more than 1%, in particular more than 1.5% of the overall length of the projection objective and/or more than 1%, in particular more than 5% of the largest lens diameter.

Preferred projection objectives are distinguished by a number of advantageous design and optical features which are conducive alone or in combination with one another for suiting the objective for ultra-fine microlithography, in particular in the optical near field, and for immersion lithography.

At least one aspheric surface is preferably arranged in the region of the system diaphragm. It is preferred for a plurality of surfaces with aspherics to come in close succession behind the diaphragm. In particular, at least one double aspheric lens that is preferably a biconvex lens can be provided between the system diaphragm and image plane. Thus, at least one double spherical biconvex lens can also be advantageous in the region between the waist and image plane, that is to say in the last belly. It can further be advantageous when the last optical surface in front of the system diaphragm and the first optical surface behind the system diaphragm are aspheric. In particular, it is possible here to provide opposite aspheric surfaces having curvatures pointing away from the diaphragm. The high number of aspheric surfaces in the region of the system diaphragm is advantageous for the correction of the spherical aberration, and has an advantageous effect on the setting of the isoplanatism.

At least one meniscus lens with an object-side concave surface is preferably provided in the region directly in front of the system diaphragm. With higher apertures, at least two such meniscuses following one another and capable of having positive or negative refractive power may be advantageous. In the case of very high aperture angles of $NA \geq 1.0$, preference is given to a group of two such meniscuses for which a meniscus with negative refractive power follows a meniscus with positive refractive power. The negative refractive power is preferably so high that a slight cross-sectional construction (auxiliary waist) can occur in the beam.

A meniscus group with a positive meniscus and a negative meniscus situated therebehind, in the case of which group the centers of curvature of all the optical surfaces are situated on the object side or reticle side, can also be advantageous independently of the other features of the invention in the case of other projection objectives, particularly directly in front of diaphragm in the range of large beam diameters, in which case the diaphragm can be a physical diaphragm for changing the beam diameter, or a conjugate diaphragm.

It has proved, furthermore, to be advantageous when at least one meniscus lens with negative refractive power and with a concave surface directed toward the image is arranged between the waist and the system diaphragm. At least two consecutive such meniscus lenses whose centers of curvature lie on the image side are frequently particularly advantageous. It is advantageous in this case when the refractive power of the first, object-side meniscus is at least 30% stronger than that of the following, image-side meniscus of the meniscus group.

It can be advantageous, furthermore, when at least one positive meniscus lens having an object-side concave surface is arranged between the waist and the system diaphragm in the vicinity of the waist. Instead of a meniscus lens of this type, a plurality of, for example two, consecutive lenses of this type may also be provided in this case.

Particularly advantageous are embodiments in the case of which arranged between the waist and the system diaphragm in this order are at least one meniscus lens with an object-side concave surface and, therebehind, at least one meniscus lens with an image-side concave surface. In each case, two consecutive meniscuses of the respective curvatures are preferably provided. The meniscus lenses facing the waist preferably have a positive refractive power, while the meniscuses facing the image plane preferably have a negative one. A change in the position of the centers of curvature of meniscuses thereby takes place in the region between these lenses or lens groups.

It is preferred for a plurality of negative lenses to be arranged consecutively in the region of the waist, there being at least two, preferably three negative lenses in preferred embodiments. The said lenses bear the main load of the Petzval correction.

At least two negative lenses are advantageous at the object-side input of the system during entry into the first belly, in order to widen the beam coming from the object. Three or more such negative lenses are preferred. It is advantageous in the case of high input apertures of more than 0.2 when at least one aspheric surface is provided on at least one of the first lenses. Each of the input-side negative lenses preferably has at least one aspheric surface.

A lens group with a strong positive refractive power which constitutes the first belly in the beam guides preferably follows behind this input group. In this group, at least one meniscus lens with positive refractive power and image-side concave surfaces can be advantageous in the region of large beam heights in the near zone of the object plane. In the case of such a meniscus whose centers of curvature are situated on the image side, the exit side facing the image preferably has a relatively strong curvature whose radius can, for example, be smaller than 50% of the overall length of the projection objective.

In addition to emerging from the claims, the foregoing and further features also emerge from the description and the drawing, it being possible for each of the individual features to be implemented alone or multiply in the form of subcombinations for one embodiment of the invention and in other fields, and to constitute advantageous designs which are patentable on their own merit.

DETAILED DESCRIPTION OF THE PREFERRED EMBODIMENTS

In the following description of the preferred embodiment, the term "optical axis" denotes a straight line through the centers of curvature of the spherical optical components or through the axes of symmetry of aspheric elements. Directions and distances are described as on the image side, on the wafer side or toward the image when they are directed in the direction of the image plane or the substrate which is located there and is to be exposed, and as on the object side, on the reticle side or toward the object when they are directed toward the object with reference to the optical axis. In the examples, the object is a mask (reticle) with the pattern of an integrated circuit, but another pattern, for example a grating, can also be involved. In the examples, the image is formed on a wafer serving as substrate and provided with a photoresist layer, but other substrates are also possible, for example elements for liquid crystal displays or substrates for optical gratings. The focal lengths specified are focal lengths with respect to air.

Figure 1:
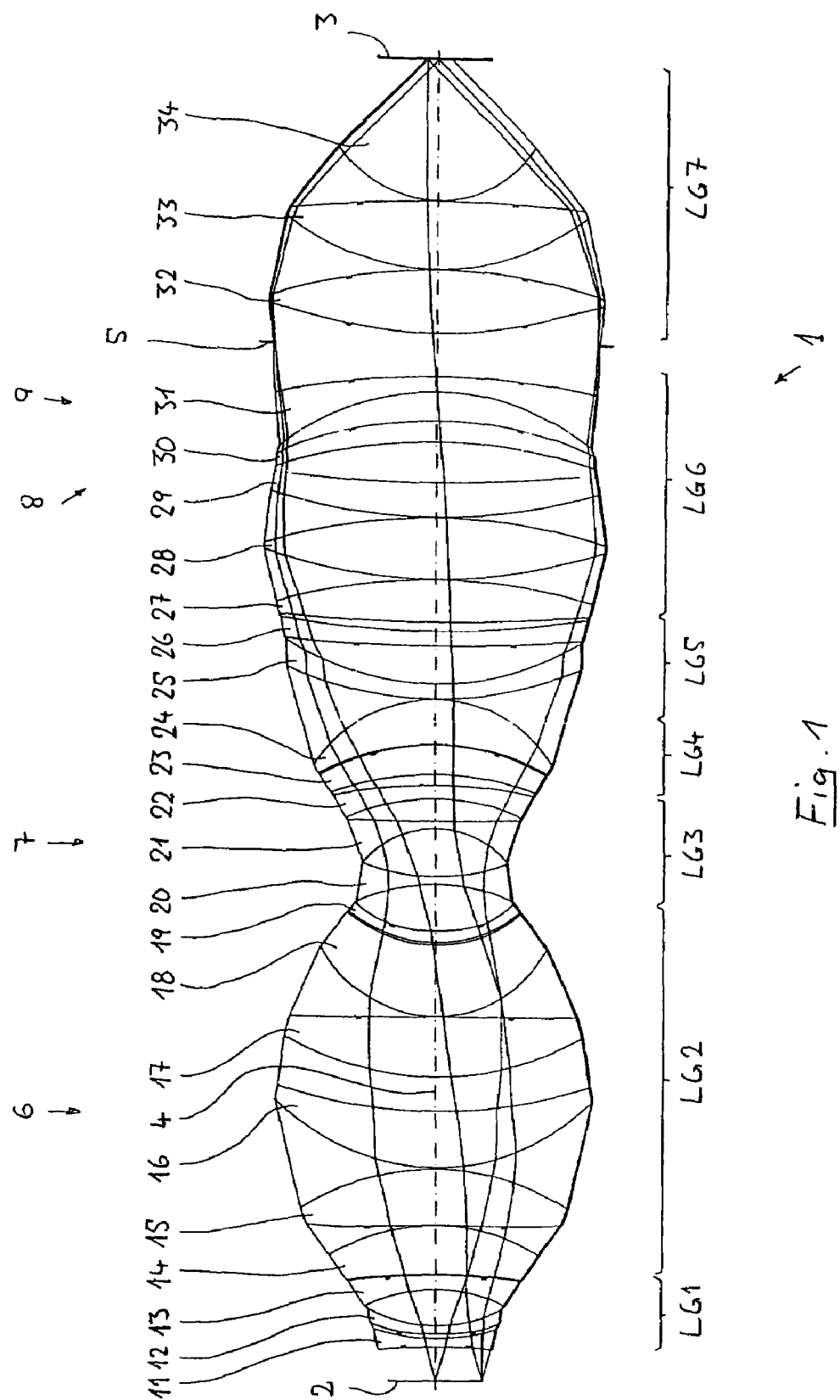
FIG. 1 is a lens section through an exemplary embodiment of a refractive projection objective that is designed for an operating wavelength of 193 nm.

FIG. 1 shows a characteristic design of an inventive, purely refractive reduction objective 1. It serves the purpose of projecting a pattern, arranged in an object plane 2, of a reticle or the like into an image plane 3, conjugate with the object plane, to a reduced scale without instances of obscuration or shading in the image field, for example to the scale of 5:1. This is a rotational symmetrical single-waist system whose lenses are arranged along an optical axis 4, which is perpendicular to the object plane and image plane, and form an object-side belly 6, an image-side belly 8 and a waist 7 situated therebetween. A small auxiliary waist 9 close in front of the system diaphragm 5 is formed inside the second belly 8. The system diaphragm 5 is situated in the region, near the image, of large beam diameters.

The lenses can be subdivided into a plurality of consecutive lens groups with specific properties and functions. A first lens group LG1, following the object plane 2, at the input of the projection objective has a negative refractive power overall, and serves to expand the beam coming from the object field. A subsequent second lens group LG2 with a positive refractive power overall forms the first belly 6 and recombines the beam in front of the following waist 7. A third lens group LG3 with a negative refractive power is located in the region of the waist 7. The said third lens group is followed by a lens group 4, consisting of positive meniscus lenses, with a positive refractive power, which is followed by a fifth lens group LG5, consisting of negative meniscus lenses, with a negative refractive power. The subsequent lens group LG6 with a positive refractive power guides the radiation to the system diaphragm 5. Situated behind the latter is the seventh and last lens group LG7, which consists of three individual lenses with a positive refractive power and makes the main contribution to the production of the very high image-side numerical aperture of NA=1.1. It holds for the latter that: NA=n*sin u', n being the refractive index of the last optical medium (for example an immersion fluid) and u' being half the image-side aperture angle.

The first lens group LG1 opens with three negative lenses 11, 12, 13 which comprise, in this order, a biconcave negative lens 11 with an aspheric entry side, a negative meniscus lens 12 with an image-side center of curvature and an aspheric entry side, and a negative meniscus lens 13 with an object-side center of curvature and an aspheric exit side. Given the high input aperture of 0.2125 present, at least one aspheric surface should be provided on at least one of the first two lenses 11, 12, in order to limit the production of aberrations in this region. As in the present example, a (at least one) aspheric surface is preferably provided at each of the three negative lenses.

With a slight air separation behind the last lens 13 of the first lens group LG1, the second lens group LG2 has a positive meniscus lens 14 with an object-side center of curvature, a further positive meniscus lens 15 with an object-side center of curvature, a positive meniscus lens 16 with an image-side center of curvature, a further positive lens 17 with a virtually flat exit side, a positive meniscus lens 18 with an image-side center of curvature of the surfaces, and a meniscus lens 20 of low refractive power and of the same direction of curvature with virtually parallel lens surfaces. The only weakly curved entrance side of the lens 15, the likewise only weakly curved exit side of the lens 17 and the exit side of the last meniscus lens 20 are aspheric. This second lens group LG2 constitutes the first belly 6 of the objective. A particular feature is formed by the positive meniscus lens 16 which is arranged at the greatest diameter and whose centers of curvature are situated on the image side. The radius of the exit surface of this lens 16 has a value that is smaller than half the object/image spacing. This lens group serves the purpose, chiefly, of the Petzval correction, the distortion and telecentering correction and the image field correction outside the main sections.

The third lens group LG3 consists of three negative meniscus lenses 20, 21, 22 whose boundary surfaces are spherical in each case. This lens group bears the main load of the correction of the image field curvature and is fashioned such that despite the high system aperture of NA=1.1 the maximum incidence angles of the beams striking the lens surfaces are below approximately 60° or the sine of the incidence angles is below 0.85 in each case. The first negative lens 20 of the third group is preferably a strongly biconcave lens such that the main waist 7 opens with strongly curved surfaces.

The fourth lens group LG4, following the waist 7, consists of two positive meniscus lenses 24, 25 with object-side concave surfaces, the exit side of the input-side meniscus lens 23 being aspheric, and the remaining surfaces being spherical. In the case of other embodiments, it is also possible to provide at this point only a single positive meniscus of appropriate curvature.

The subsequent fifth lens group LG5 likewise has two meniscus lenses 25, 26, but these each have a negative refractive power, and the concave surfaces are directed toward the image field 3. If appropriate, it is also possible to provide at this point only one negative meniscus whose center of curvature is situated on the wafer side. It has been found to be advantageous for the negative refractive power of the object-side negative meniscus 25 to be at least 30% stronger than that of the following meniscus 26. Such a group with at least one negative meniscus is a central correction element for the functioning of the single-waist system, in order to correct off-axis aberrations elegantly. In particular, this permits a compact design with relatively small lens diameters.

It is particularly important, furthermore, that a change in the position of the centers of curvature between meniscuses of the fourth lens group LG4 and the fifth lens group LG5 takes place in the input region, following the waist 7, of the second belly 8. It is possible to achieve thereby that inclined spherical aberration in the case of an extreme aperture can be smoothed.

The sixth lens group LG6 begins with a sequence of positive lenses 27, 28, 29, 30 in which case it has proved to be advantageous when at least two of these lenses are biconvex lenses, such as the immediately consecutive lenses 27, 28, each having spherical lens surfaces, at the input of the sixth lens group. In the example, a weakly positive meniscus lens 29 with an image-side concave surface follows the biconvex lenses 27, 28.

Present at the output of the sixth lens group LG6 directly in front of the system diaphragm 5 is a meniscus group with two meniscus lenses 30, 31 whose centers of curvature are all situated on the reticle side or object side. Particularly in the case of objectives with a low aperture, it would also be possible to provide at this location only one appropriate meniscus lens with positive or negative refractive power. The two-fold group 30, 31 shown is preferred for the very high aperture of NA≧1 shown, the input-side meniscus lens 30 preferably having a positive refractive power, and the meniscus lens 31 following therefrom preferably having a negative refractive power. The negative refractive power thereof is advantageously so high that a slight constriction in the form of an auxiliary waist 9 is produced in the beam path. It is possible thereby to achieve the possibility of balancing out the inclined spherical tangential and inclined spherical sagittal approaches.

The seventh lens group LG7, arranged between the system diaphragm 5 and image plane 3, constitutes a further special feature of inventive projection objectives. Special measures are required particularly in this region, for the purpose of managing the superficial loading of the optical surfaces overall such that it is possible to achieve imaging with low aberration in conjunction with adequate transmission of the entire objective. It should be ensured for this purpose between the system diaphragm 5 and wafer 3 that no apertures are produced in the component which result in an aperture near 1 as a component in respect to air. A substantial contribution to achievement of this aim is made here by virtue of the fact that a planoconvex lens 34 with spherical entrance surface and flat exit surface is arranged as last optical element directly in front of the image plane 3. Said lens is so thick that its diameter is more than half the diameter of the system diaphragm 5, ideally even more than 60% or 70% of this value. The aim is as long a radius as possible with a high opening of this, preferably spherical, entrance surface. It is necessary to target this long radius since the field loading of the entrance surface is thereby diminished. The longer the radius, the smaller the relative field, and thus the smaller the induced field aberrations. The entrance surface can also be aspheric.

The planoconvex group near the image, which is formed here by a single, unipartite lens element 34, has a refractive action. This may be seen from the fact that the entrance surface is not arranged concentrically with the middle of the image field, because the radius differs from the lens thickness. Preference is given to axially elongated lenses of this type, in the case of which the center of curvature of the entrance surface is situated inside the lens. Planoconvex groups or planoconvex lenses of this type therefore differ substantially from hemispherical planoconvex lenses, in the case of which the radius corresponds substantially to their thickness, and which are used, for example, in microscopy in order to improve the launching of the light into the microscope objective, and are themselves precluded from having refracting properties.

Figure 2:
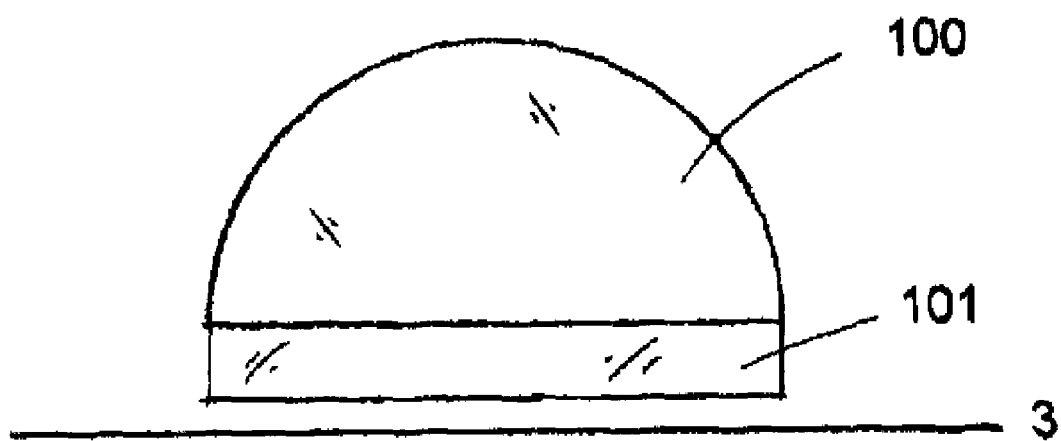
FIG. 2 shows an exemplary planoconvex group in the form of a divided planoconvex lens in which the division is performed along a flat dividing surface.

Alternatively, the lens element 34 can be a planoconvex group that is constructed in the form of a divided planoconvex lens, FIG. 2 shows an exemplary embodiment in which the last lens element is a planoconvex group whose upper part 100 and lower part 101 are wrung onto each other along a flat dividing surface. The lower part 101 is a plane-parallel plate.

Figure 3:
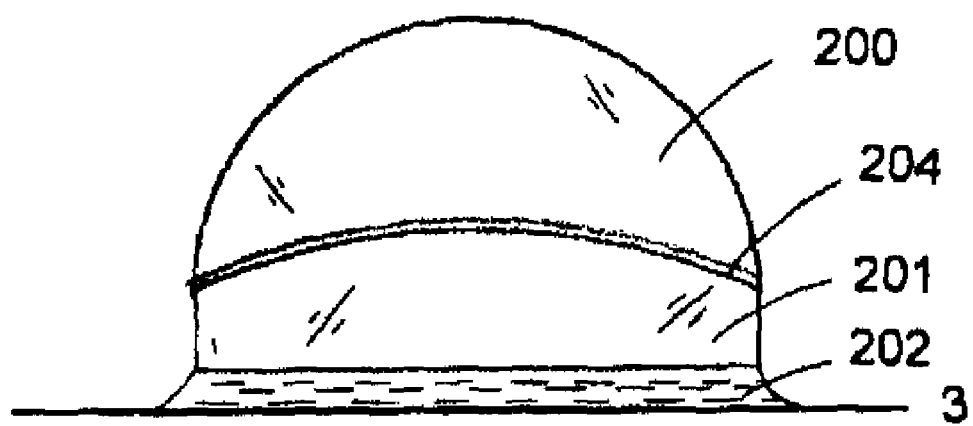
FIG. 3 shows an exemplary planoconvex group in the form of a divided planoconvex lens in which the division is performed along a curved dividing surface.

FIG. 3 shows an exemplary embodiment in which the last lens element is a planoconvex group that is divided into an upper part 200 and lower part 201 along a curved dividing surface. A small air spacing 204 is present between the upper part 200 and the lower part 201 of the planoconvex group. The width of the small air spacing 204 may be less than one millimeter. The radii of the upper part 200 and the lower part 200 of the planoconvex group may be curved in relation to the small air spacing 204 so that no total reflection occurs. An immersion fluid 202 may be introduced between the planar exit surface of the lower part 201 and the image plane 3.

In the case of the embodiment shown, two very large positive lenses 32, 33 that provide the essential contribution to the system refractive power are placed upstream of the planoconvex meniscus 34. Because they are seated right behind the diaphragm in the region of large beam diameters, the relative field loading is minimized here as well. This example therefore shows a very simple and efficient design of a lithographic objective suitable for very high apertures with reference to the region behind the system diaphragm 5. The planoconvex meniscus 34 picks up with a low refractive power the convergent pencil, coming from the positive lenses 32, 33 in air or in another suitable gaseous medium inside the projection objective and passes it on into the photosensitive layer of the substrate. Consequently, embodiments for which exclusively positive lenses are present between the system diaphragm 5 and wafer 3 are advantageous, although it is also further possible for one or more plane-parallel plates to be provided. Again, as low as possible a number of optical surfaces is advantageous in this region, since each surface causes reflection losses even in the case of good antireflective coating. The number of lenses should be four or less here, it being optionally possible, once again, for plane-parallel plates to be provided.

Further advantageous measures consist in that surfaces with aspherics should be provided in the region of the diaphragm, in particular right behind said diaphragm. Said surfaces can be opposite one another in a lens as is the case with the biconvex, double aspheric positive lens 32. It is advantageous, moreover, when an aspheric surface is provided both immediately in front of the diaphragm plane and immediately therebehind. In the example, these are the exit surface of the negative meniscus 31 and the entrance surface of the biconvex positive lens 32. In the case of the example, the high number of aspheres in the region around the system diaphragm 5 serves chiefly for correcting the spherical aberration (Zernike coefficients Z9, Z16, Z25, Z26, Z36, Z49), as well as setting the isoplanatism, that is to say for correcting the magnification ratio affected by aperture.

The specification of the design is summarized in a known way in tabular form in Table 1. Here, column 1 gives the number of a refracting surface, or one distinguished in another way, column 2 gives the radius r of the surface (in mm), column 3 gives the distance d, denoted as thickness, of the surface from the following surface (in mm), column 4 gives the material of the optical components, and column 5 gives the refractive index of the material of the component, which follows the entry surface. The useful, free radii or half the free diameter of the lenses (in mm) are specified in column 6.

TABLE 1

| SURFACE | RADII | THICKNESSES | GLASSES | REFRACTIVE INDEX 193.304 nm | ½ FREE DIAMETER |
| --- | --- | --- | --- | --- | --- |
| 0 | 0.000000000 | 27.200000000 | L710 | 0.99998200 | 45.607 |
| 1 | 0.000000000 | 5.918415780 | L710 | 0.99998200 | 53.333 |
| 2 | −856.520151429AS | 8.513391670 | SIO2HL | 1.56028895 | 54.216 |
| 3 | 221.390186129 | 4.416825103 | N2 | 1.00000320 | 58.807 |
| 4 | 388.002080060AS | 7.500000000 | SIO2HL | 1.56028895 | 62.597 |
| 5 | 145.662170604 | 35.066769313 | N2 | 1.00000320 | 64.799 |
| 6 | −156.528478897 | 13.825053459 | SIO2HL | 1.56028895 | 68.237 |
| 7 | −569.268909317AS | 1.048245321 | N2 | 1.00000320 | 84.737 |
| 8 | −685.623617269 | 46.805975671 | SIO2HL | 1.56028895 | 86.118 |
| 9 | −204.957576367 | 0.709606715 | N2 | 1.00000320 | 103.144 |
| 10 | −880.911273998AS | 54.777943597 | SIO2HL | 1.56028895 | 125.013 |
| 11 | −248.526945989 | 1.683182576 | N2 | 1.00000320 | 131.423 |
| 12 | 224.822351709 | 54.871581452 | SIO2HL | 1.56028695 | 156.309 |

TABLE 1-continued

| SURFACE | RADII | THICKNESSES | GLASSES | REFRACTIVE INDEX 193.304 nm | ½ FREE DIAMETER |
|---|---|---|---|---|---|
| 13 | 512.337183722 | 33.734945339 | N2 | 1.00000320 | 153.303 |
| 14 | 304.374483761 | 58.667551666 | SIO2HL | 1.56028895 | 146.757 |
| 15 | −6287.676161070AS | 0.700000000 | N2 | 1.00000320 | 140.984 |
| 16 | 129.979785804 | 69.743588545 | SIO2HL | 1.56028895 | 112.463 |
| 17 | 138.594373293 | 2.395572054 | N2 | 1,00000320 | 85.809 |
| 18 | 138.485177581 | 10.992090105 | SIO2HL | 1.56028895 | 84.654 |
| 19 | 162.930027134AS | 45.897552290 | N2 | 1.00000320 | 78.232 |
| 20 | −186.365747641 | 7.500000000 | SIO2HL | 1.56028895 | 75.979 |
| 21 | 209.249850090 | 47.901412683 | N2 | 1.00000320 | 70.469 |
| 22 | −92.976145902 | 7.500000000 | SIO2HL | 1.56028895 | 70.319 |
| 23 | 3940.003552383 | 22.698881573 | N2 | 1.00000320 | 84.285 |
| 24 | −210.566279065 | 13.458540900 | SIO2HL | 1.56028895 | 86.301 |
| 25 | −481.930608562 | 10.599713214 | N2 | 1.00000320 | 96.309 |
| 26 | −299.003037123 | 29.233512385 | SIO2HL | 1.56028895 | 100.896 |
| 27 | −211.128540124AS | 0.700000000 | N2 | 1.00000320 | 111.974 |
| 28 | −241.783293846 | 45.186608069 | SIO2HL | 1.56028895 | 113.068 |
| 29 | −142.093795869 | 0.700000000 | N2 | 1.00000320 | 118.747 |
| 30 | 373.228657636 | 15.000000000 | SIO2HL | 1.56028895 | 144.714 |
| 31 | 281.545559695 | 37.551434993 | N2 | 1.00000320 | 144.973 |
| 32 | 2257.943358151AS | 15.000000000 | SIO2HL | 1.56028895 | 146.555 |
| 33 | 942.886809577 | 9.018344987 | N2 | 1.00000320 | 151.237 |
| 34 | 1839.757565259 | 41.221307008 | SIO2HL | 1.56028895 | 152.796 |
| 35 | −572.892294825 | 0.700000000 | N2 | 1.00000320 | 156.198 |
| 36 | 536.885209090 | 59.927790928 | SIO2HL | 1.56028895 | 168.303 |
| 37 | −588.394317091 | 0.700000003 | N2 | 1.00000320 | 168.532 |
| 38 | 600.944472100 | 32.859055286 | SIO2HL | 1.56028895 | 162.458 |
| 39 | 1435.651038119 | 39.540839130 | N2 | 1.00000320 | 158.952 |
| 40 | −542.595637794 | 21.000000000 | SIO2HL | 1.56028895 | 157.309 |
| 41 | −421.356226662AS | 28.605920520 | N2 | 1.00000320 | 156.999 |
| 42 | −253.952587228 | 15.000000000 | SIO2HL | 1.56028895 | 153.788 |
| 43 | −804.677872363AS | 32.000000000 | N2 | 1.00000320 | 158.842 |
| 44 | 0.000000000 | 10.700000010 | N2 | 1.00000320 | 162.250 |
| 45 | 439.828583479AS | 60.615863511 | SIO2HL | 1.56028895 | 169.169 |
| 46 | −554.126799640AS | 0.854609370 | N2 | 1.00000320 | 169.058 |
| 47 | 251.288231110 | 66.707994802 | SIO2HL | 1.56028895 | 152.022 |
| 48 | −1261.158042833AS | 0.700000000 | N2 | 1.00000320 | 149.150 |
| 49 | 120.292681477 | 139.355322544 | SIO2HL | 1.56028895 | 99.158 |
| 50 | 0.000000000 | 0.000000000 | SIO2HL | 1.56028895 | 11.402 |
| 51 | 0.000000000 | 0.000000000 | | 1.00000000 | 11.402 |

In the case of the embodiment, thirteen of the surfaces, specifically the surfaces 2, 4, 7, 10, 15, 19, 27, 32, 41, 43, 45, 46 and 48 are aspheric. Table 2 specifies the corresponding aspheric data, the aspheric surfaces being calculated using the following rule:

$$p(h) = [((1/r)h^2)/(1 + SQRT(1-(1+K)(1/r)^2 h^2))] + C1*h^4 + C2*h^6 + \ldots$$

Here, the reciprocal (1/r) of the radius specifies the surface curvature, and h the distance of a surface point from the optical axis. Consequently, p(h) gives the so-called sagitta, that is to say the distance of the surface point from the surface apex in the z direction, that is to say in the direction of the optical axis. The constants K, C1, C2, ... are reproduced in Table 2.

TABLE 2

| SURFACE NO. 2 | |
|---|---|
| K | 0.0000 |
| C1 | −2.94971307e−008 |
| C2 | −5.57984348e−011 |
| C3 | 8.46982512e−015 |
| C4 | 5.00708078e−019 |
| C5 | −3.78477968e−022 |
| C6 | 4.94732324e−026 |

TABLE 2-continued

| C7 | −2.07498764e−030 |
| C8 | 0.00000000e+000 |
| C9 | 0.00000000e+000 |
| SURFACE NO. 4 | |
|---|---|
| K | 0.0000 |
| C1 | 2.26266925e−007 |
| C2 | 4.12437333e−011 |
| C3 | −8.13482251e−015 |
| C4 | −9.73333957e−019 |
| C5 | 5.21683282e−022 |
| C6 | −6.98262222e−026 |
| C7 | 3.24713110e−030 |
| C8 | 0.00000000e+000 |
| C9 | 0.00000000e+000 |
| SURFACE NO. 7 | |
| K | 0.0000 |
| C1 | 2.14406930e−008 |
| C2 | 4.01486796e−013 |
| C3 | −1.15749689e−016 |
| C4 | −2.17404465e−020 |
| C5 | 4.76039865e−024 |
| C6 | −4.04274950e−028 |
| C7 | 2.26352156e−032 |
| C8 | 0.00000000e+000 |
| C9 | 0.00000000e+000 |

TABLE 2-continued

SURFACE NO. 10

| | |
|---|---|
| K | 0.0000 |
| C1 | 4.04801375e−008 |
| C2 | 3.59502309e−013 |
| C3 | −4.82739756e−017 |
| C4 | −2.12222071e−021 |
| C5 | 3.16153319e−025 |
| C6 | −1.24031349e−029 |
| C7 | 1.72585585e−034 |
| C8 | 0.00000000e+000 |
| C9 | 0.00000000e+000 |

SURFACE NO. 15

| | |
|---|---|
| K | 0.0000 |
| C1 | 1.77772008e−009 |
| C2 | 6.20555687e−014 |
| C3 | 1.17962639e−018 |
| C4 | −3.75710986e−023 |
| C5 | 8.23659263e−027 |
| C6 | −3.78043433e−031 |
| C7 | 5.28341681e−036 |
| C8 | 0.00000000e+000 |
| C9 | 0.00000000e+000 |

SURFACE NO. 19

| | |
|---|---|
| K | 0.0000 |
| C1 | 1.12510953e−007 |
| C2 | 5.25382772e−012 |
| C3 | 3.54985200e−016 |
| C4 | 2.17219317e−020 |
| C5 | 3.35596515e−024 |
| C6 | −1.94149952e−028 |
| C7 | 4.47299373e−032 |
| C8 | 0.00000000e+000 |
| C9 | 0.00000000e+000 |

SURFACE NO. 27

| | |
|---|---|
| K | 0.0000 |
| C1 | 2.75008177e−008 |
| C2 | −4.51696088e−013 |
| C3 | −5.50353634e−018 |
| C4 | −2.48871975e−022 |
| C5 | −4.84285060e−026 |
| C6 | 4.35721702e−030 |
| C7 | −1.70355795e−034 |
| C8 | 0.00000000e+000 |
| C9 | 0.00000000e+000 |

SURFACE NO. 32

| | |
|---|---|
| K | 0.0000 |
| C1 | 4.61774725e−009 |
| C2 | −1.45428945e−013 |
| C3 | 5.33766031e−018 |
| C4 | −1.05172907e−022 |
| C5 | 1.13262775e−027 |
| C6 | 2.90828821e−032 |
| C7 | −9.47335184e−037 |
| C8 | 0.00000000e+000 |
| C9 | 0.00000000e+000 |

SURFACE NO. 41

| | |
|---|---|
| K | 0.0000 |
| C1 | −1.74774919e−009 |
| C2 | 3.60065638e−015 |
| C3 | −6.33371869e−019 |
| C4 | −2.58752868e−023 |
| C5 | −1.29026764e−027 |
| C6 | 4.06422380e−032 |
| C7 | −2.03413277e−036 |
| C8 | 0.00000000e+000 |
| C9 | 0.00000000e+000 |

SURFACE NO. 43

| | |
|---|---|
| K | 0.0000 |
| C1 | −1.52776855e−009 |
| C2 | 3.99966157e−014 |
| C3 | −3.59152071e−019 |
| C4 | −2.46490776e−023 |
| C5 | 2.62578515e−028 |
| C6 | 9.94510225e−032 |
| C7 | −1.17559041e−036 |
| C8 | 0.00000000e+000 |
| C9 | 0.00000000e+000 |

SURFACE NO. 45

| | |
|---|---|
| K | 0.0000 |
| C1 | −6.79036688e−009 |
| C2 | −4.98113790e−014 |
| C3 | 2.59739233e−018 |
| C4 | −5.22422066e−023 |
| C5 | 1.38345858e−028 |
| C6 | −9.60600374e−033 |
| C7 | −4.93449545e−037 |
| C8 | 0.00000000e+000 |
| C9 | 0.00000000e+000 |

SURFACE NO. 46

| | |
|---|---|
| K | 0.0000 |
| C1 | −1.23311338e−009 |
| C2 | 9.47803783e−014 |
| C3 | −6.59387651e−020 |
| C4 | −4.20864177e−023 |
| C5 | −4.65343524e−028 |
| C6 | −7.27238546e−033 |
| C7 | 5.62850375e−037 |
| C8 | 0.00000000e+000 |
| C9 | 0.00000000e+000 |

SURFACE NO. 48

| | |
|---|---|
| K | 0.0000 |
| C1 | 2.98238360e−010 |
| C2 | −6.63488568e−014 |
| C3 | 8.08884615e−018 |
| C4 | −1.56191602e−022 |
| C5 | −6.64400102e−029 |
| C6 | 3.42882241e−032 |
| C7 | −1.87278246e−037 |
| C8 | 0.00000000e+000 |
| C9 | 0.00000000e+000 |

The optical system 1, which can be reproduced with the aid of these data, is designed for an operating wavelength of approximately 193 nm, for which the synthetic quartz glass used for all the lenses has a refractive index n=1.56029. The image-side numerical aperture is 1.1. The objective has an overall length (distance between image plane and object plane) of 1297 mm. A photoconductance (product of the numerical aperture and image size) of 24.1 mm results, given an image size of 22 mm. The image-side working distance, that is to say the distance between the plane exit surface of the last optical element 34 and the image plane 3 is not itemized separately. It can be 20 to 50 nm, for example. The projection objective is therefore suitable for near-field lithography.

If the aim is rather to conduct immersion lithography instead of near-field lithography, this is easily possible through slight modifications. If an immersion medium has substantially the same refractive index as the last optical element of the objective (which consists, for example, of glass or crystal), to attain a larger distance to the image plane the solid is shortened and the larger interspace produced is filled by the immersion medium, for example de-ionized water. If the refractive index of the immersion medium deviates from that of the last optical component, the two thicknesses are tuned to one another as well as possible. If appropriate, it is advantageous to have a spherical subsequent correction that can be carried out, for example, by adjusting air spacings with the aid of suitable manipulators on one or more lens elements. It can also be advantageous for the design represented here by way of example to be slightly modified.

A projection objective is thereby created which operates at an operating wavelength of 193 nm, can be produced with the aid of conventional techniques for the lens production and coatings, and permits a resolution of structures far below 100 nm. Many design measures that are useful alone or in combination, and the novel design of the region between the system diaphragm 5 and the image plane 3, permit a total aperture of 1.1 in the medium to be exposed, in conjunction with relatively low superficial loadings of the optical surfaces within the projection objective. Structural widths in the region of 50 nm can be outstandingly represented despite the gigantic aperture of 1.1. This becomes clear from low values of transverse aberration and a wavefront RMS value of 2.6 m$\lambda$ at 193 nm over all image heights.

The example presented offers further possibilities of development in the direction of higher aperture and/or a lesser number of interfaces. For example, a few lenses neighboring one another in pairs can be combined to form a single lens in each case, in order in this way to reduce the number of interfaces by two in each case. For example, the lenses 23 and 24, the lenses 18 and 19, the lenses 13 and 14, the lenses 26 and 27 and/or the lenses 11 and 12 can be combined in each case to form one lens. Aspheric surfaces are to be installed or to be modified in this case, if appropriate. A combination of lenses is advantageous, in particular, for shorter wavelengths, for example of 157 nm, in which case problems can arise with the coating and the surface roughness of lens surfaces. If appropriate, a further positive lens can be advantageous behind the diaphragm given very high apertures in order, in the event of increases in aperture, to introduce as few new aberrations affected by aperture as possible.

The advantages of the invention are useful not only given purely refractive projection objectives, but also given catadioptric projection objectives, in particular those which operate with geometric or physical (polarization-selective) beam splitting. Special features occur chiefly for design and function in the region of the system diaphragm near the image and between said diaphragm and the image plane. The upstream objective parts, which comprise at least one projecting mirror in the case of catadioptric projection objectives, should provide at least one overcorrection of the longitudinal chromatic aberration, in order to compensate the corresponding undercorrection of the last lens group. A Petzval overcorrection should preferably be provided in order to provide a margin for the Petzval undercorrection of the last lens group. Since, in a way similar to an individual positive lens, said last lens group is undercorrected with reference to spherical aberration, the upstream objective part should work overall in a spherically overcorrecting fashion. The measures for attaining these optical characteristics are known to the person skilled in the art and are therefore not explained in more detail here.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. A projection objective for projecting a pattern arranged in an object plane of the projection objective into an image plane of the projection objective with the aid of ultraviolet light of a prescribed operating wavelength with the aid of an immersion medium that is arranged between an exit surface of the projection objective and the image plane, the projection objective comprising:
   a multiplicity of optical elements which are arranged along an optical axis;
   an optical group with refractive power next to the image plane; wherein
   the optical group comprises a planoconvex group having a substantially spherical entrance surface,
   the exit surface of the projection objective is arranged on the planoconvex group, and
   the planoconvex group is constructed as a divided planoconvex lens.

2. The projection objective as claimed in claim 1, wherein the planoconvex lens is divided into a part of the planoconvex lens near the image plane and a part of the planoconvex lens more remote from the image plane, and the parts of the planoconvex lens consist of different optical materials.

3. The projection objective as claimed in claim 2, wherein the part more remote from the image plane consists of synthetic quartz glass, and the part near the image plane consists of calcium fluoride.

4. The projection objective as claimed in claim 1, wherein the planoconvex lens is divided along a dividing surface into a part of the planoconvex lens near the image plane and a part of the planoconvex lens more remote from the image plane, and the parts of the planoconvex lens are joined along the dividing surface by wringing.

5. The projection objective as claimed in claim 1 wherein the planoconvex lens is divided into a part of the planoconvex lens near the image plane and a part of the planoconvex lens more remote from the image plane, and the parts of the planoconvex lens contact each other along a curved dividing surface.

6. The projection objective as claimed in claim 5, wherein a spacing exists in at least some parts between the part of the planoconvex lens more remote from the image plane and the part of the planoconvex lens near the image plane, and the spacing is smaller than 1 millimeter in an entire cross section between the parts of the planoconvex lens.

7. The projection objective as claimed in claim 6, wherein radii of the parts of the planoconvex lens at the spacing are curved in relation to the spacing such that no total reflection occurs.

8. The projection objective as claimed in claim 1, wherein the planoconvex lens is divided into a part of the planoconvex lens near the image plane and a part of the planoconvex lens more remote from the image plane, and the part of the planoconvex lens near the image plane consists of a material which is more radiation-resistant than a material of the part of the planoconvex lens more remote from the image plane.

9. The projection objective as claimed in claim 1, wherein the projection objective has an image-side numerical aperture that is not less than 1.

10. A projection objective for projecting a pattern arranged in an object plane of the projection objective into an image plane of the projection objective with the aid of ultraviolet light of a prescribed operating wavelength, comprising:
    a multiplicity of optical elements which are arranged along an optical axis; and
    an optical group with refractive power next to the image plane; wherein:
    the optical group comprises a planoconvex group having a substantially spherical entrance surface and an exit surface,
    the planoconvex group is constructed as a divided planoconvex lens, the planoconvex lens is divided into a part of the planoconvex lens near the image plane and a part of the planoconvex lens more remote from the image plane, and the parts of the planoconvex lens consist of different optical materials, and the part near the image plane consists of calcium fluoride and the part more remote from the image plane consists of synthetic quartz glass.

11. A projection objective for projecting a pattern arranged in an object plane of the projection objective into an image plane of the projection objective with the aid of ultraviolet light of a prescribed operating wavelength, comprising:

a multiplicity of optical elements which are arranged along an optical axis; and an optical group with refractive power next to the image plane; wherein:

the optical group comprises a planoconvex group having a substantially spherical entrance surface and an exit surface, the planoconvex group is constructed as a divided planoconvex lens, the planoconvex lens is divided into a part of the planoconvex lens near the image plane and a part of the planoconvex lens more remote from the image plane, and the parts of the planoconvex lens consist of different optical materials, and the part of the planoconvex lens near the image plane is a plane-parallel end plate.

12. The projection objective as claimed in claim 11, wherein the end plate is wrung onto the part of the planoconvex lens more remote from the image plane.

13. A projection objective for projecting a pattern arranged in an object plane of the projection objective into an image plane of the projection objective with the aid of ultraviolet light of a prescribed operating wavelength, comprising:

a multiplicity of optical elements which are arranged along an optical axis; and an optical group with refractive power next to the image plane; wherein:

the optical group comprises a planoconvex group having a substantially spherical entrance surface and an exit surface, the planoconvex group is constructed as a divided planoconvex lens, the planoconvex lens is divided into a part of the planoconvex lens near the image plane and a part of the planoconvex lens more remote from the image plane, and the parts of the planoconvex lens contact each other along a curved dividing surface.

14. The projection objective as claimed in claim 13, wherein a spacing exists in at least some parts between the part of the planoconvex lens more remote from the image plane and the part of the planoconvex lens near the image plane, and the spacing is smaller than 1 millimeter in an entire cross section between the parts of the planoconvex lens.

15. The projection objective as claimed in claim 14, wherein radii of the parts of the planoconvex lens at the spacing are curved in relation to the spacing such that no total reflection occurs.

16. A projection objective for projecting a pattern arranged in an object plane of the projection objective into an image plane of the projection objective with the aid of ultraviolet light of a prescribed operating wavelength, comprising:

a multiplicity of optical elements which are arranged along an optical axis; and an optical group with refractive power next to the image plane; wherein:

the optical group comprises a planoconvex group having a substantially spherical entrance surface and an exit surface, the planoconvex group is constructed as a divided planoconvex lens, the planoconvex lens is divided into a part of the planoconvex lens near the image plane and a part of the planoconvex lens more remote from the image plane, and the part of the planoconvex lens near the image plane consists of a material which is more radiation-resistant than a material of the part of the planoconvex lens more remote from the image plane.

* * * * *